United States Patent
Huang et al.

(10) Patent No.: US 10,855,317 B2
(45) Date of Patent: Dec. 1, 2020

(54) BROADBAND RECEIVER FOR MULTI-BAND MILLIMETER-WAVE WIRELESS COMMUNICATION

(71) Applicant: Swiftlink Technologies Inc., Richmond (CA)

(72) Inventors: Min-Yu Huang, Atlanta, GA (US); Thomas Chen, Vancouver (CA)

(73) Assignee: SWIFTLINK TECHNOLOGIES INC., Richmond (CA)

( * ) Notice: Subject to any disclaimer, the term of this patent is extended or adjusted under 35 U.S.C. 154(b) by 0 days.

(21) Appl. No.: 16/414,480

(22) Filed: May 16, 2019

(65) Prior Publication Data

US 2019/0312604 A1 Oct. 10, 2019

Related U.S. Application Data

(63) Continuation-in-part of application No. 15/946,716, filed on Apr. 5, 2018, now Pat. No. 10,411,745.

(60) Provisional application No. 62/836,295, filed on Apr. 19, 2019.

(51) Int. Cl.
*H04B 1/10* (2006.01)
*H04B 1/00* (2006.01)
(Continued)

(52) U.S. Cl.
CPC ............. *H04B 1/006* (2013.01); *H01Q 1/247* (2013.01); *H03F 3/45192* (2013.01); *H03F 3/68* (2013.01); *H04B 1/48* (2013.01); *H03F 2200/165* (2013.01); *H03F 2200/171* (2013.01); *H03F 2200/267* (2013.01); *H03F 2200/294* (2013.01); *H03F 2200/336* (2013.01);
(Continued)

(58) Field of Classification Search
CPC .......... H04B 1/006; H04B 1/48; H01Q 1/247; H03F 3/45192; H03F 3/68; H03F 2200/165; H03F 2200/171; H03F 2200/267; H03F 2200/294; H03F 2200/336; H03F 2200/451; H03F 2203/45296; H03F 2203/45374
USPC ......................................................... 455/285
See application file for complete search history.

(56) References Cited

U.S. PATENT DOCUMENTS 6,057,714 A 5/2000 Andrys et al.
6,374,093 B1 * 4/2002 Pesola ...................... H03D 7/18
455/188.1

(Continued)

*Primary Examiner* — Sonny Trinh
(74) *Attorney, Agent, or Firm* — Womble Bond Dickinson (US) LLP (57) ABSTRACT

An RF receiver includes a low-noise amplifier (LNA) to receive and amplify RF signals, a transformer-based IQ generator circuit, one or more load resisters, one or more mixer circuit, and a downconverter. The transformer-based IQ generator is to generate a differential in-phase local oscillator (LOI) signal and a differential quadrature (LOQ) signal based on a local oscillator (LO) signal received from an LO. The load resisters are coupled to an output of the transformer-based IQ generator. Each of the load resisters is to couple one of the differential LOI and LOQ signals to a predetermined bias voltage. The mixers are coupled to the LNA and the transformer-based IQ generator to receive and mix the RF signals amplified by the LNA with the differential LOI and LOQ signals to generate an in-phase RF (RFI) signal and a quadrature RF (RFQ) signal. The downconverter is to down convert the RFI signal and the RFQ signal into IF signals.

20 Claims, 9 Drawing Sheets

(51) Int. Cl.
*H03F 3/68* (2006.01)
*H03F 3/45* (2006.01)
*H04B 1/48* (2006.01)
*H01Q 1/24* (2006.01)

(52) U.S. Cl.
CPC ............... *H03F 2200/451* (2013.01); *H03F 2203/45296* (2013.01); *H03F 2203/45374* (2013.01)

(56) References Cited

U.S. PATENT DOCUMENTS

| | | | |
|---|---|---|---|
| 6,917,815 B2 * | 7/2005 | Hajimiri | H04B 1/005 455/285 |
| 7,386,291 B2 * | 6/2008 | Floyd | H04B 1/30 455/205 |
| 7,493,141 B2 * | 2/2009 | Brobston | H04B 1/006 455/285 |
| 9,837,194 B1 | 12/2017 | Folker et al. | |
| 2006/0019625 A1 | 1/2006 | Puglia | |
| 2006/0057983 A1 | 3/2006 | Thompson et al. | |
| 2008/0113644 A1 | 5/2008 | Trotta et al. | |
| 2008/0182526 A1 | 7/2008 | Moloudi et al. | |
| 2008/0305759 A1 | 12/2008 | Tervaluoto et al. | |
| 2009/0047921 A1 * | 2/2009 | Hayashi | H03D 7/18 455/308 |
| 2010/0093295 A1 | 4/2010 | Olson | |
| 2010/0130139 A1 | 5/2010 | Panikkath et al. | |
| 2013/0202071 A1 | 8/2013 | Wei et al. | |
| 2013/0281043 A1 | 10/2013 | Mu | |
| 2013/0316668 A1 | 11/2013 | Davierwalla et al. | |
| 2017/0149404 A1 | 5/2017 | Tsai et al. | |
| 2019/0312604 A1 * | 10/2019 | Huang | H03F 3/45192 |

\* cited by examiner

BROADBAND RECEIVER FOR MULTI-BAND MILLIMETER-WAVE WIRELESS COMMUNICATION

RELATED APPLICATIONS

This application is a continuation-in-part (CIP) of U.S. patent application Ser. No. 15/946,716, filed Apr. 5, 2018. This application also claims the benefit of U.S. provisional patent application No. 62/836,295, filed Apr. 19, 2019. The disclosure of the aforementioned applications is incorporated by reference herein in its entirety.

FIELD OF THE INVENTION

Embodiments of the present invention relate generally to wireless communication devices. More particularly, embodiments of the invention relate to a multi-band image-reject receiver for a communication device.

BACKGROUND

For next-generation 5G communication devices, a higher data rate is required for many applications such as augmented reality (AR)/virtual reality (VR), and fifth generation (5G) multiple-input and multiple-output (MIMO). A design shift towards millimeter-wave (mm-wave) frequency supports this higher data rate. Meanwhile, a broader bandwidth is required to facilitate the higher data rate. For example, a broader bandwidth should cover the 5G spectrum including the 24, 28, 37, and 39 GHz bands.

A low intermediate frequency (IF) receiver architecture may be popular for communication devices to avoid drawbacks from a zero-IF down-conversion receiver such as flicker noise and dc offset. However, mm-wave wideband in-phase quadrature (IQ) local oscillator (LO) generation for a low-IF receiver can be very lossy degrading performance of down-conversion mixers of the receiver. There is a need for an on-chip receiver with wideband image rejection at mm-wave frequency.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, etc., may be used without departing from the scope of the disclosure.

According to an aspect of the invention, an RF receiver includes a low-noise amplifier (LNA) to receive and amplify RF signals, a transformer-based IQ generator circuit, one or more load resistors, and a downconverter having one or more mixers. The transformer-based IQ generator is configured to generate a differential in-phase local oscillator (LOI) signal and a differential quadrature (LOQ) signal based on a local oscillator (LO) signal received from an LO. The load resistors are coupled to an output of the transformer-based IQ generator. Each of the load resistors is configured to couple one of the differential LOI and LOQ signals to a predetermined bias voltage. The mixers are coupled to the LNA and the transformer-based IQ generator to receive and mix the RF signals amplified by the LNA with the differential LOI and LOQ signals to down convert the amplified RF signals into IF signals, which can be processed by a signal processing module or a signal processor such as a digital signal processor (DSP).

According to one embodiment, the transformer-based IQ generator includes a positive LOI (LOI+) port to produce an LOI+ signal based on the LO signal. The transformer-based IQ generator further includes a negative LOI (LOI−) port to produce an LOI− signal based on the LO signal. The LOI+ and LOI− signals represent a differential LOI signal. The transformer-based IQ generator further includes a positive LOQ (LOQ+) port to produce an LOQ+ signal based on the LO signal and a negative LOQ (LOQ−) port to produce an LOQ− signal based on the LO signal. The LOQ+ and LOQ− signals represent a differential LOQ signal.

In one embodiment, the mixers include a first mixer and a second mixer. The downconverter includes a first low-pass filter coupled to the first mixer to mix an RF signal with the LOI+ signal to generate a positive in-phase IF (IFI+) signal, a second low-pass filter coupled to the second mixer to mix the RF signal with the LOI− signal to generate a negative in-phase IF (IFI−) signal, and a first IF amplifier coupled to the first and second low-pass filters to amplify the IFI+ and IFI− signals to generate a first differential IF signal.

In one embodiment, the mixers further include a third mixer and a fourth mixer. The downconverter further includes a third low-pass filter coupled to the third mixer to mix the RF signal with the LOQ+ signal to generate a positive quadrature IF (IFQ+) signal, a fourth low-pass filter coupled to the fourth mixer to mix the RF signal with the LOQ− signal to generate a negative quadrature IF (IFQ−) signal, and a second IF amplifier coupled to the third and fourth low-pass filters to amplify the IFQ+ and IFQ− signals to generate a second differential IF signal. In one embodiment, the downconverter further includes a poly-phase filter (PPF) coupled to the first IF amplifier and the second IF amplifier to generate a third differential IF signal based on the first and second differential IF signals, and a third IF amplifier coupled to the PPF to amplify the third differential IF signal to generate a fourth differential IF signal, wherein the fourth differential IF signal is processed by the signal processing module.

In one embodiment, the load resistors include a first load resistor coupled between the LOI+ port and the predetermined bias voltage, a second load resistor coupled between the LOI− port and the predetermined bias voltage, a third load resistor coupled between the LOQ+ port and the predetermined bias voltage, and a fourth load resistor coupled between the LOQ− port and the predetermined bias voltage. Each of the load resistors is ranging from 50 to 500 ohms. The differential LOI and the differential LOQ signals are ranging from 25 to 50 gigahertz (GHz).

In one embodiment, each of the mixers includes a first stage amplifier, where the first stage amplifier comprises a first differential transistor (or metal-oxide semiconductor field-effect transistor, short for MOSFET) pair having a first and a second transistor, where a first gate terminal of the first transistor and a second gate terminal of the second transistor together forms a differential RF input port to receive a differential RF input signal to be mixed; and a second stage amplifier coupled to the first stage amplifier, where the second stage amplifier includes a second differential transistor (or MOSFET) pair having a third transistor with a third gate terminal and a fourth transistor with a fourth gate terminal and a third differential transistor pair having a fifth transistor with a fifth gate terminal and a sixth transistor with a sixth gate terminal, where the third gate terminal is coupled to the fifth gate terminal and the fourth gate terminal is coupled to the sixth gate terminal, where the third gate terminal and the fifth gate terminal forms a differential LO input port to receive a differential LO drive signal to drive the mixer.

In another embodiment, a first drain terminal of the first transistor of the first differential transistor pair is coupled to source terminals of the third and the fourth transistors of the second differential transistor pair via a first inductor, and a second drain terminal of the second transistor of the first differential transistor pair is coupled to source terminals of the fifth and the sixth transistors of the third differential transistor pair via a second inductor, where the first and the second inductors form a differential inductor pair. In another embodiment, a drain terminal of the third transistor is coupled to a drain terminal of the fifth transistor as a first output, a drain terminal of the fourth transistor is coupled to a drain terminal of the sixth transistor as the second output, where the first and the second output forms a differential output port to output a differential mixed signal.

According to another aspect, an RF frontend circuit includes a transmitting and receiving (T/R switch to be coupled an antenna, an RF transmitter, and an RF receiver, where the T/R switch is configured to couple the RF transmitter or the RF receiver to the antenna at a particular point in time. The RF receiver includes at least some of the components as described above. According to a further aspect, a mobile device includes an antenna, an RF receiver, and a signal processor. The RF receiver includes at least some of the components as described above.

Figure 1:
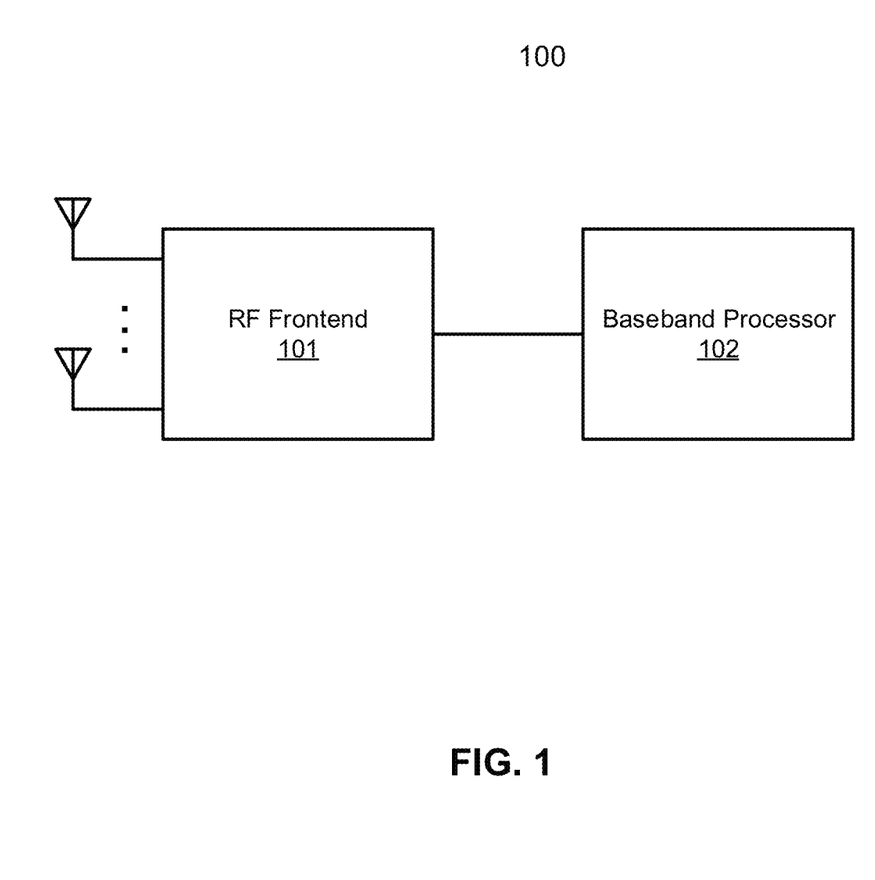
FIG. 1 is a block diagram illustrating an example of a wireless communication device according one embodiment.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often referred to as a low-noise block (LNB) or low-noise downconverter (LND) and is often located near or at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip 101 further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package, which will be described in details further below.

Figure 2:
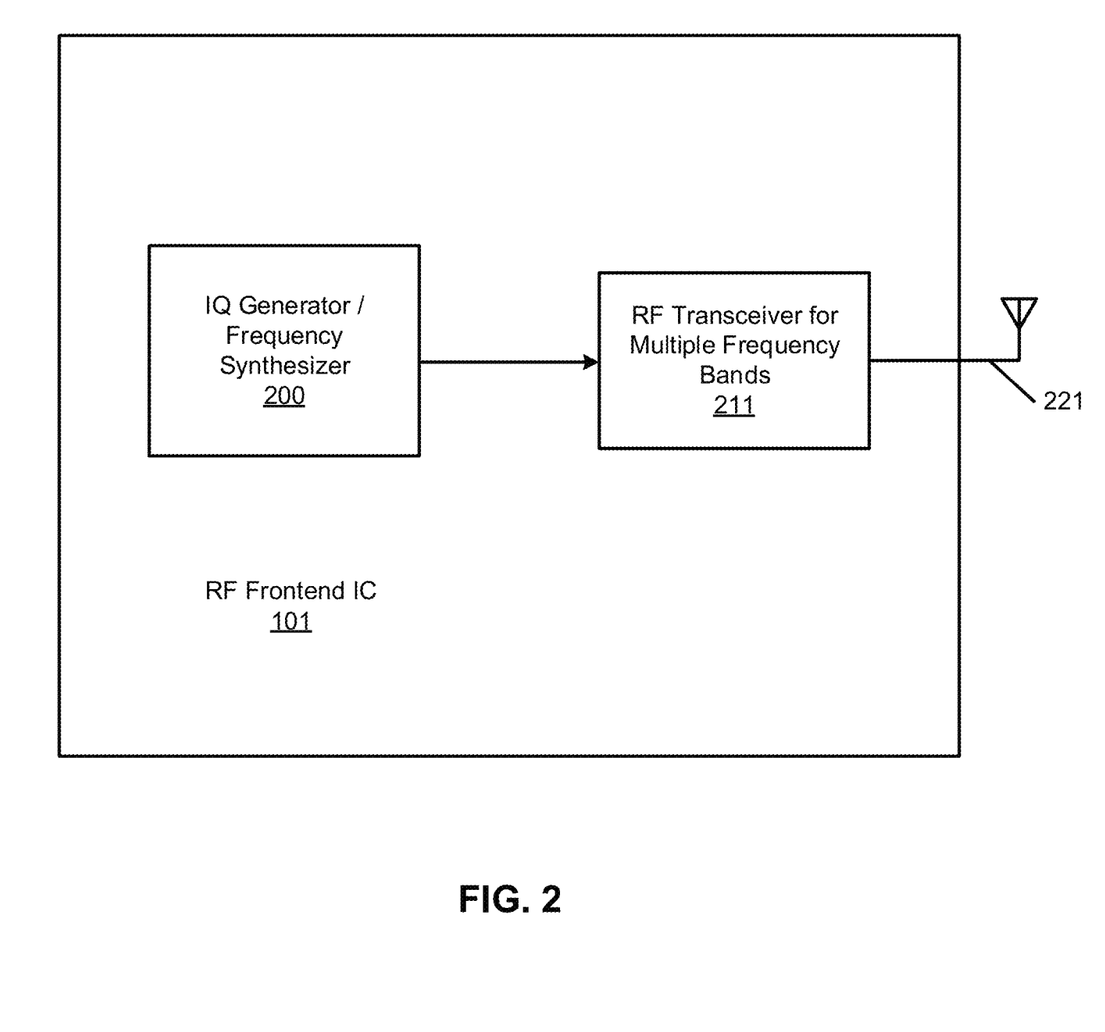
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, an IQ generator and/or frequency synthesizer 200 coupled to a multi-band RF transceiver 211. Transceiver 211 is configured to transmit and receive RF signals within one or more frequency bands or a broad range of RF frequencies via RF antenna 221. In one embodiment, transceiver 211 is configured to receive one or more LO signals from IQ generator and/or frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
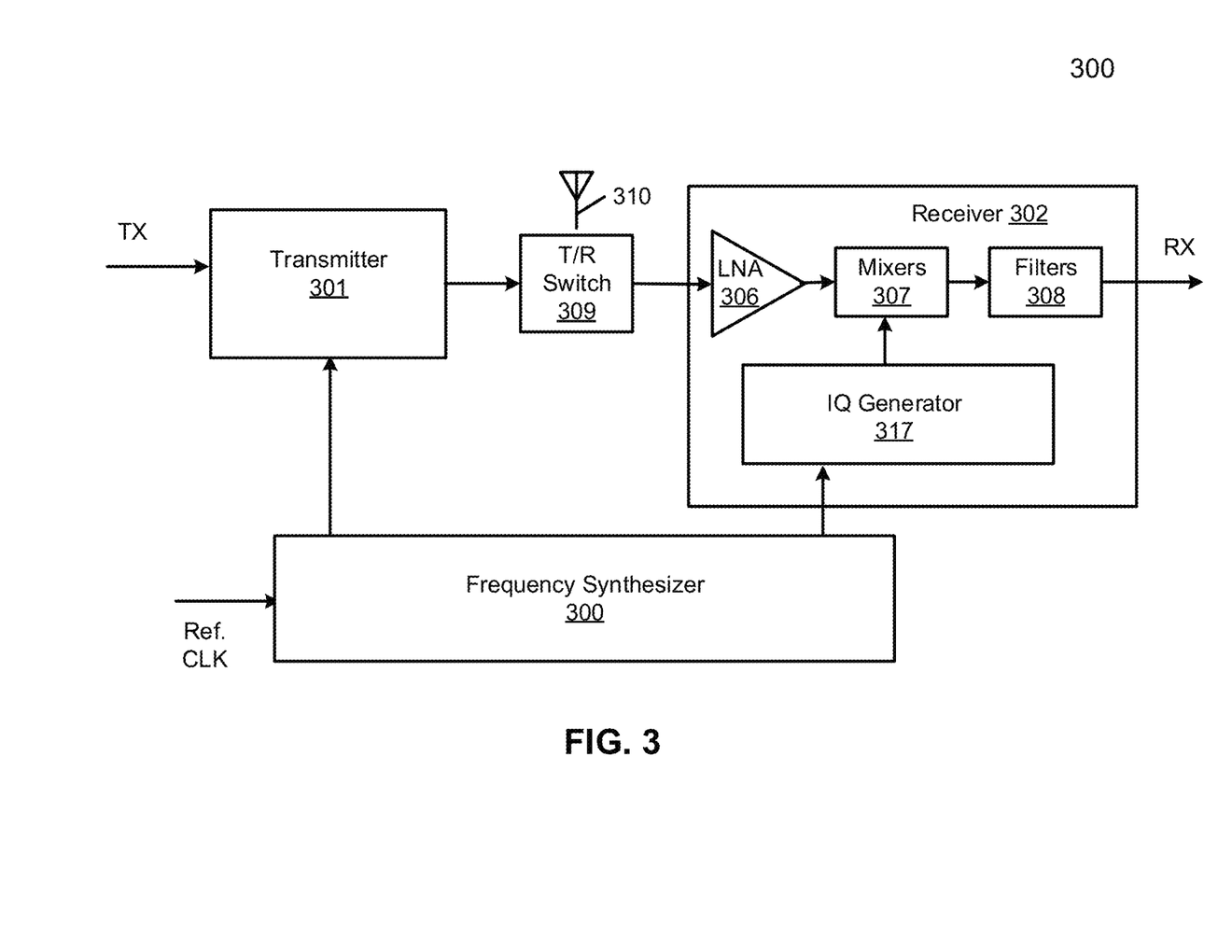
FIG. 3 is a block diagram illustrating an RF transceiver integrated circuit according to one embodiment.

FIG. 3 is a block diagram illustrating an RF transceiver integrated circuit (IC) according to one embodiment. RF transceiver 300 may represent RF transceiver 211 of FIG. 2. Referring to FIG. 3, frequency synthesizer 300 may represent frequency synthesizer 200 as described above. In one embodiment, RF transceiver 300 can include frequency synthesizer 300, transmitter 301, and receiver 302. Frequency synthesizer 300 is communicatively coupled to transmitter 301 and receiver 302 to provide LO signals. Transmitter 301 can transmit RF signals for a number of frequency bands. Receiver 302 can receive RF signals for a number of frequency bands.

Receiver 302 includes a low noise amplifier (LNA) 306, mixer(s) 307, and filter(s) 308. LNA 306 is to receive RF signals from a remote transmitter via antenna 310 and to amplify the received RF signals. The amplified RF signals are then demodulated by mixer(s) 307 (also referred to as a down-convert mixer) based on an LO signal provided by IQ generator 317. IQ generator 317 may represent IQ generator 200 as described above. In one embodiment, IQ generator 317 is integrated into broadband receiver 302 as a single integrated circuit. The demodulated signals are then processed by filter(s) 308, which may be a low-pass filter. In one embodiment, transmitter 301 and receiver 302 share antenna 310 via a transmitting and receiving (T/R) switch 309. T/R switch 309 is configured to switch between transmitter 301 and receiver 302 to couple antenna 310 to either transmitter 301 or receiver 302 at a particular point in time. Although there is one pair of transmitter and receiver shown, multiple pairs of transmitters and receivers and/or a standalone receiver can be implemented. In one embodiment, all of the components as shown, except antenna 310, can be implemented within an integrated circuit (e.g., RF frontend IC).

Figure 4:
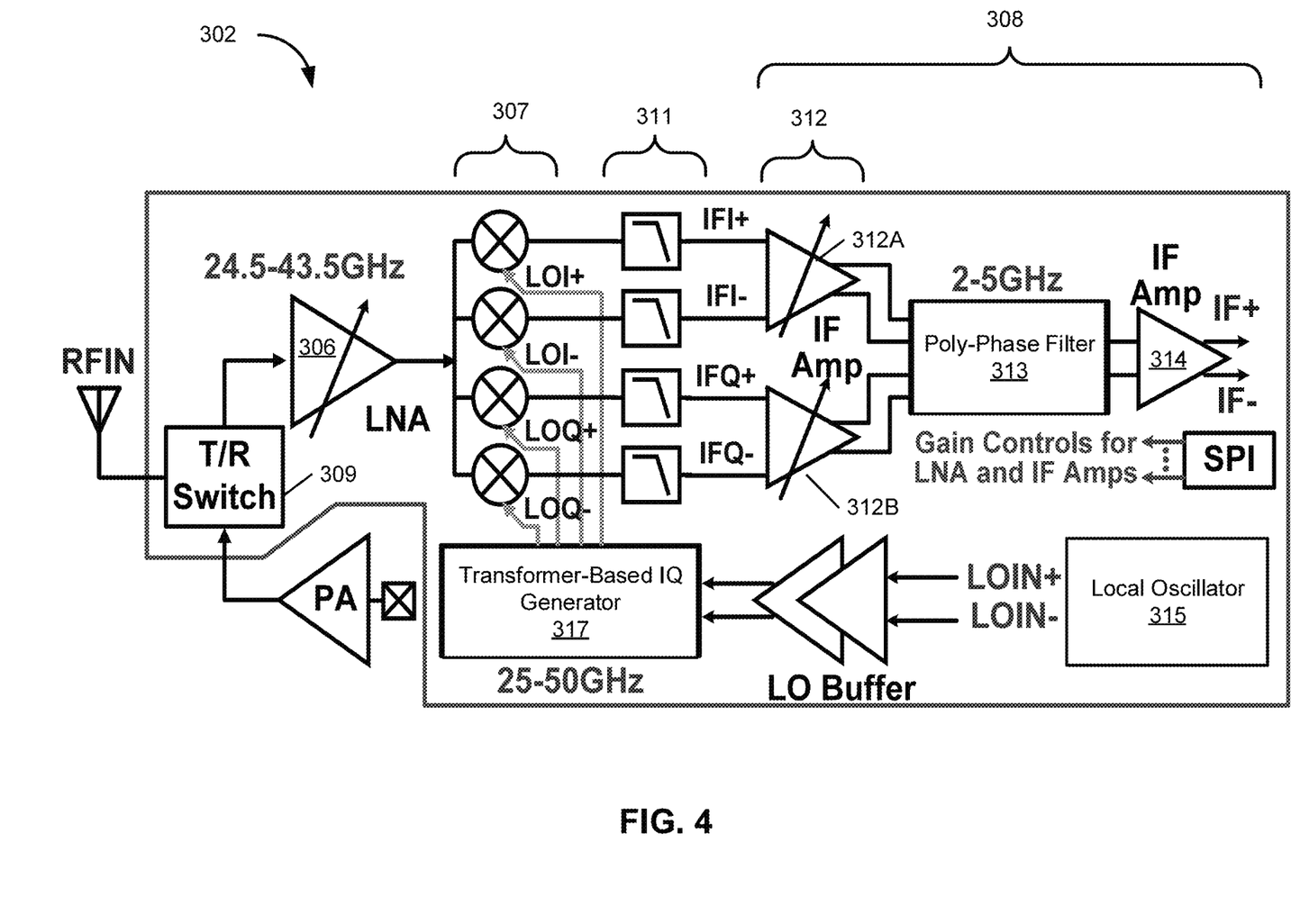
FIG. 4 is a schematic diagram illustrating an example of a wideband receiver circuit according to one embodiment.

FIG. 4 is a block diagram illustrating an example of an RF receiver according to one embodiment. Referring to FIG. 4, RF receiver 302 includes, amongst others, a low-noise amplifier (LNA) 306 to receive and amplify RF signals, a transformer-based IQ generator 317, one or more load resistors (not shown), one or more mixers 307, and a downconverter. The transformer-based IQ generator 317 is configured to generate a differential in-phase local oscillator (LOI) signal and a differential quadrature (LOQ) signal based on a local oscillator (LO) signal received from an LO 315. The load resistors are coupled to an output of the transformer-based IQ generator 317. Each of the load resistors is configured to couple one of the differential LOI and LOQ signals (e.g., LOI+, LOI−, LOQ+, or LOQ− signals in this example) to a predetermined bias voltage (not shown). The mixers 307 are coupled to the LNA 306 and the transformer-based IQ generator 317 to receive and mix the RF signals amplified by the LNA 306 with the differential LOI and LOQ signals to down convert the RF signals into IF signals, which can be processed by a signal processing module or a signal processor such as a digital signal processor (DSP). In this embodiment, the downconverter is represented by a set of low-pass filters 311, a set of one or more IF amplifiers 312 (e.g., variable gain amplifiers), a poly-phase filter 313, and another IF amplifier 314.

In this example, there are four mixers coupled to an output of LNA 306 and an output of transformer-based IQ generator 317. The output of transformer-based IQ generator 317 includes four LO signals (e.g., LOI+, LOI−, LOQ+, and LOQ− signals) based on the original LO signal provided by LO 315 (e.g., LOIN+ and LOIN−). LOI+ and LOI− represent a differential in-phase signal and LOQ+ and LOQ− represent a differential quadrature signal. LOIN+ and LOIN− represent a differential LO input signal to transformer-based IQ generator 317. Low-pass filters 311 include four low-pass filters, one for each of mixers 307 to perform a low-pass operation on the RF signals from the corresponding mixer to convert the RF signal to an IF signal, in this example, IFI+, IFI−, IFQ+, and IFQ− signals. The pair of IFI+ and IFI− signals are fed into a differential input of IF amplifiers 312A, while the pair of IFQ+ and IFQ− signals are fed into a differential input of IF amplifiers 312B. The outputs of the IF amplifiers 312 (collectively represented by IF amplifiers 312A and 312B) are coupled to an input of PPF 313. Another IF amplifier 314 is coupled to the output of PPF 313 to further amplify the IF signals. The amplified IF signals produced by IF amplifier 314 can be processed further downstream by a signal processor (e.g., DSP or baseband processor).

PPF 313 can filter out higher frequency noise and can recombine the four in-phase and quadrature signals back into a differential pair of IF signals, e.g., IFI+, IFI−, IFQ+, and IFQ− signals. PPF 313 is a resistive-capacitive capacitive-resistive (RC_CR) PPF. PPF 313 can filter out undesirable signal noise, e.g., high frequency noise outside the range of the IF frequencies, and can combine the four in-phase and quadrature signals, e.g., IFI+, IFI−, IFQ+, and IFQ− signals, into a differential pair of intermediate IF signals. Finally, amplifier 314 to further amplify the differential intermediate IF signals to generate IF+ and IF− as an output.

Figure 5:
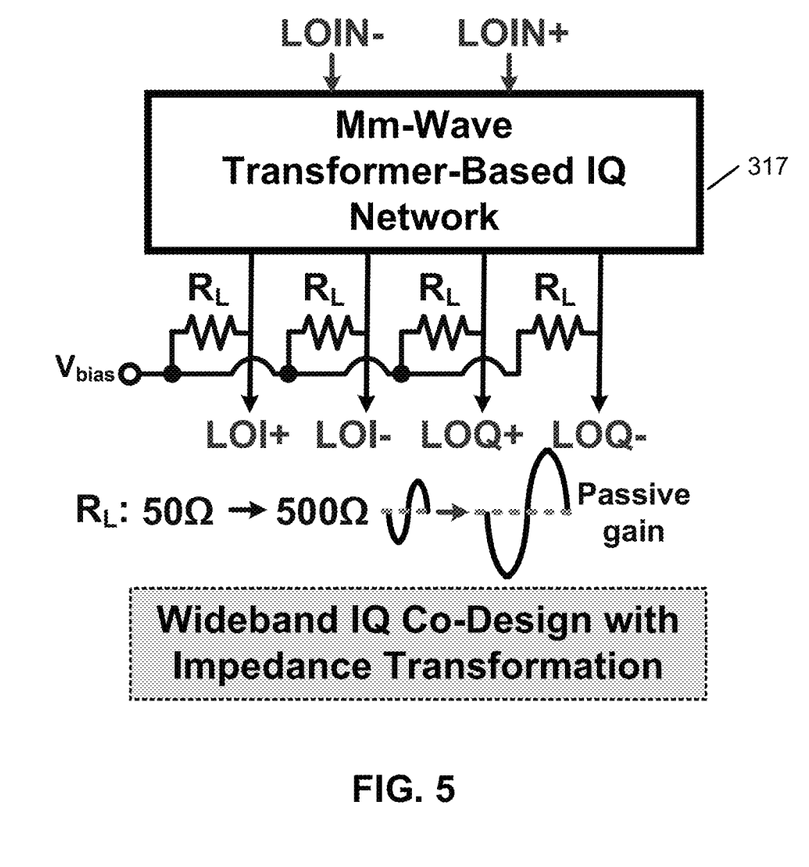
FIG. 5 is a schematic diagram illustrating an example of a transformer-based IQ generator according to one embodiment.
Figure 7:
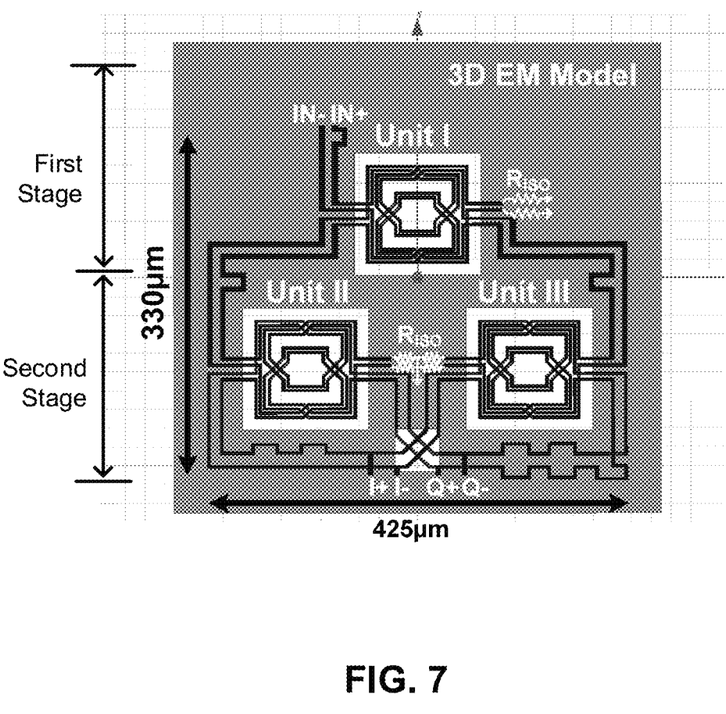
FIG. 7 is a block diagram illustrating an example of a transformer-based IQ generator layout according to one embodiment.

FIG. 5 is a schematic diagram illustrating an example of a transformer-based IQ generator according to one embodiment. Referring to FIG. 5, according to one embodiment, the transformer-based IQ generator 317, also referred to as a transformer-based IQ network, includes a positive LOI (LOI+) port to produce an LOI+ signal and a negative LOI (LOI−) port to produce an LOI− signal based on LO input signals LOIN+ and LOIN− generated from LO 315. The LOI+ and LOI− signals represent a differential in-phase signal, a positive LOQ (LOQ+) port to produce an LOQ+ signal, and a negative LOQ (LOQ−) port to produce an LOQ− signal. The LOQ+ and LOQ− signals represent a differential quadrature signal. The output signals LOI+, LOI−, LOQ+, and LOQ− are provided to inputs of mixers 307 respectively. An example of transformer-based IQ generator 317 is shown in FIG. 7.

Figure 6:
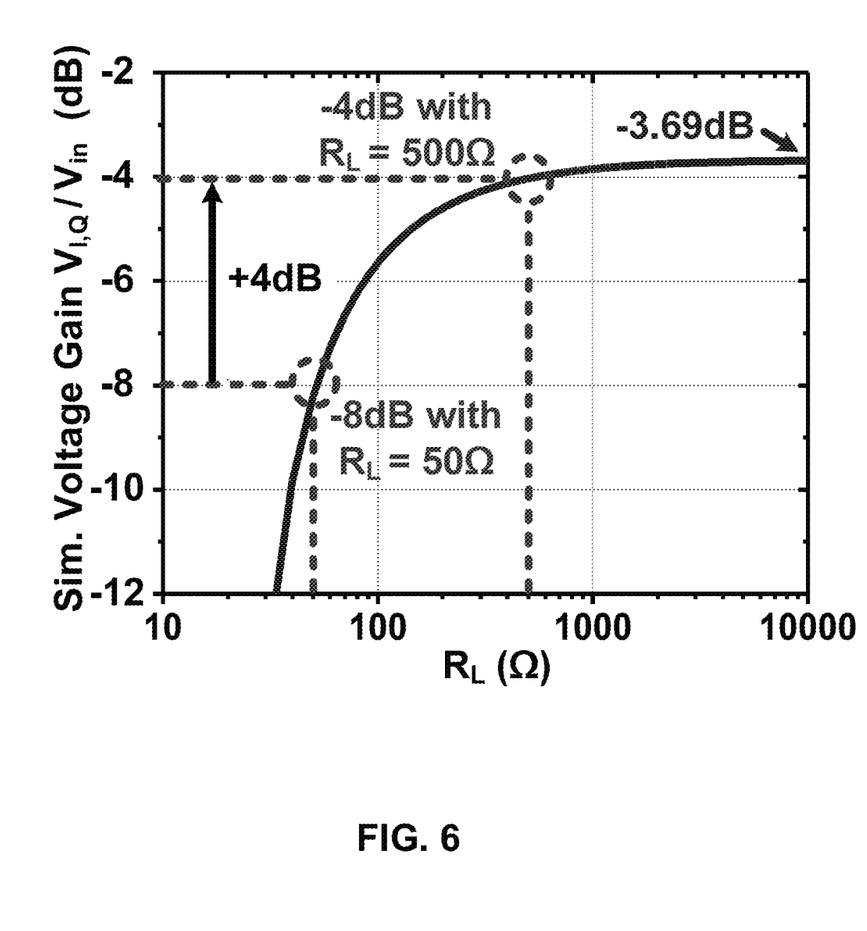
FIG. 6 shows a simulation result of voltage gain with different load resistors according to one embodiment.

According to one embodiment, a load resistor ($R_L$) is coupled between each of the output ports (LOI+, LOI−, LOQ+, and LOQ−) and a bias voltage $V_{bias}$. By connecting a load resistor to an output terminal of transformer-based IQ generator 317, the output impedance can be increased, which in turn increases the voltage applied to an input of a mixer. The higher input voltage will lead to a higher conversion gain of the mixer. FIG. 6 shows a simulation result of a voltage gain with a load resistor from 50 to 500 ohms.

Figure 8:
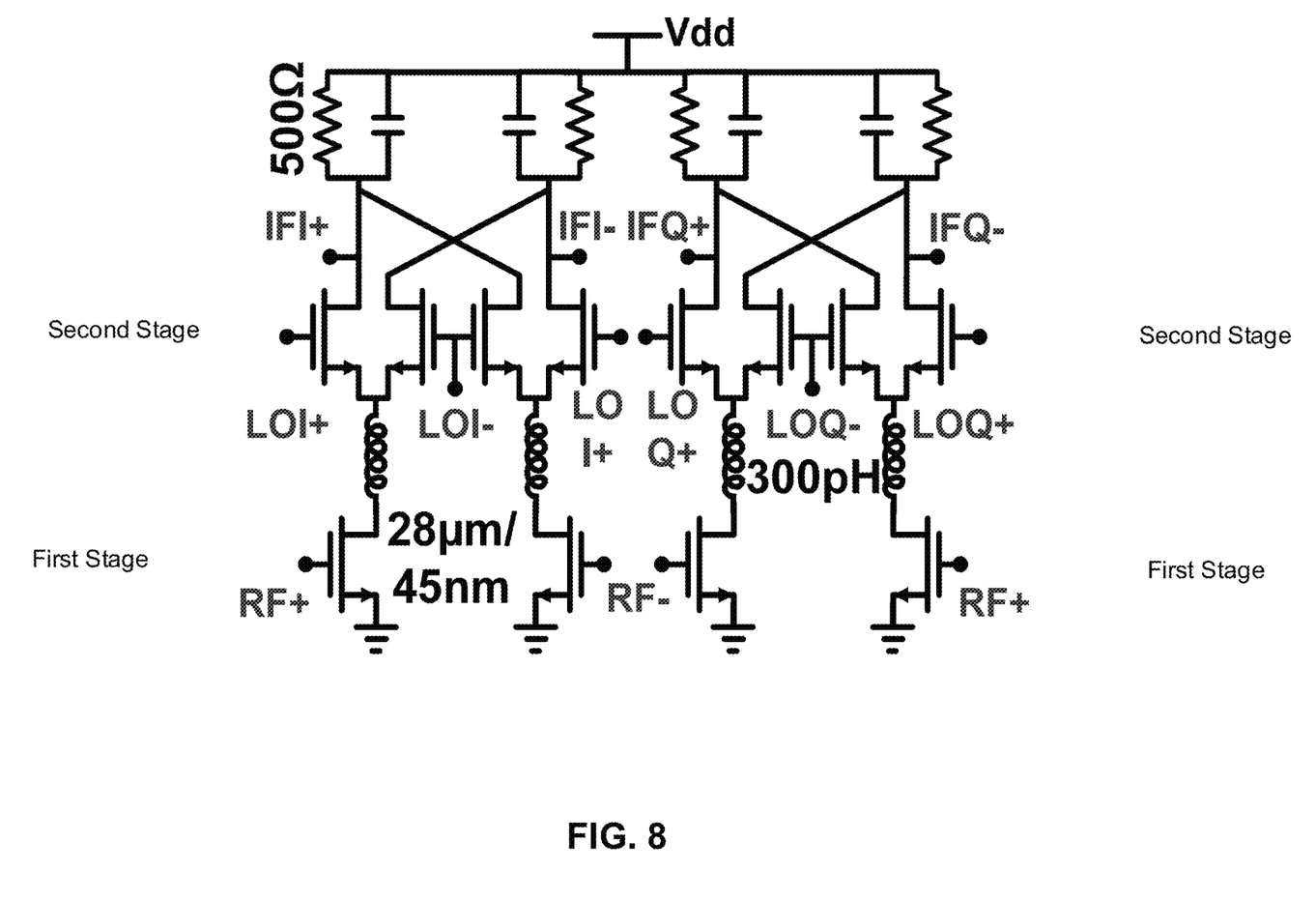
FIG. 8 is a schematic diagram illustrating an example of a mixer according to one embodiment.

FIG. 8 is a schematic diagram illustrating a mixer circuit according to one embodiment. Referring to FIG. 8, mixer 307 is an IQ double balanced mixer, including a first mixer 801 and a second mixer 802. A mixer is a three port device that can perform a frequency conversion or modulation of a signal. For a receiver, a mixer down converts (or demodulates) an RF signal using an LO signal to generate an IF signal. In one embodiment, mixers 307 includes two (or double) balanced Gilbert mixers 801 and 802. Double balanced mixers 801-802 down convert (or demodulate) a differential RF signal using differential LO signals to generate differential IF signals.

For example, mixer 801 receives a positive RF input signal RF+ and a negative RF input signal RF− representing a differential RF signal, for example, received from LNA 306. The input RF signals RF+ and RF− are mixed with differential in-phase LO signals (e.g., LOI+ and LOI− signals) to generate IFI+ and IFI− signals. The LOI+ and LOI− signals are generated by an mm-wave wideband IQ generation circuit, such as IQ generator 317 of FIG. 4. Similarly, mixer 802 receives RF+ and RF− signals and mix with differential quadrature LO signals (e.g., LOQ+ and LOQ− signals) generated by a mm-wave wideband IQ generation circuit, such as IQ generator 317 of FIG. 4, to generate IFQ+ and IFQ− signals. In some embodiments, each of mixers 801-802 can include one or more differential amplifier stages.

Referring to FIG. 8, for a two stage differential amplifier, the amplifier can include a common source differential amplifier as the first stage and a gate-coupled differential amplifier as the second stage. The common source differential amplifier stage of mixers 801-802 each can receive differential signals RF+ and RF−. The gate-coupled differential amplifier stage of mixer 801 receives differential in-phase signals LOI+ and LOI−. The gate-coupled differential amplifier stage of mixer 802 receives differential quadrature signals LOQ+ and LOQ−. The RF signal is then down converted by the LO signal to generate an IF signal. The second stage can include a low-pass filter which can be first order low-pass filters to minimize high frequency noise injections into mixers 801-802. In one embodiment, the low-pass filter includes a passive low pass filter having a load resistor in parallel with a capacitor. In one embodiment, the first stage different amplifier is coupled to the second stage differential amplifier via differential inductors. In one embodiment, mixers 801-802 is co-designed with a mm-wave IQ generation circuit such as mm-wave IQ generation circuit 317 of FIG. 4 on a single monolithic integrated circuit. In one embodiment, a differential inductor pair can be used to pick up a current gain between the two differential amplifier stages. Four inductors are included for better performance, e.g., two differential inductor pairs are used for each of the double IQ mixers. Four inductors, however, include a large foot.

Figure 9:
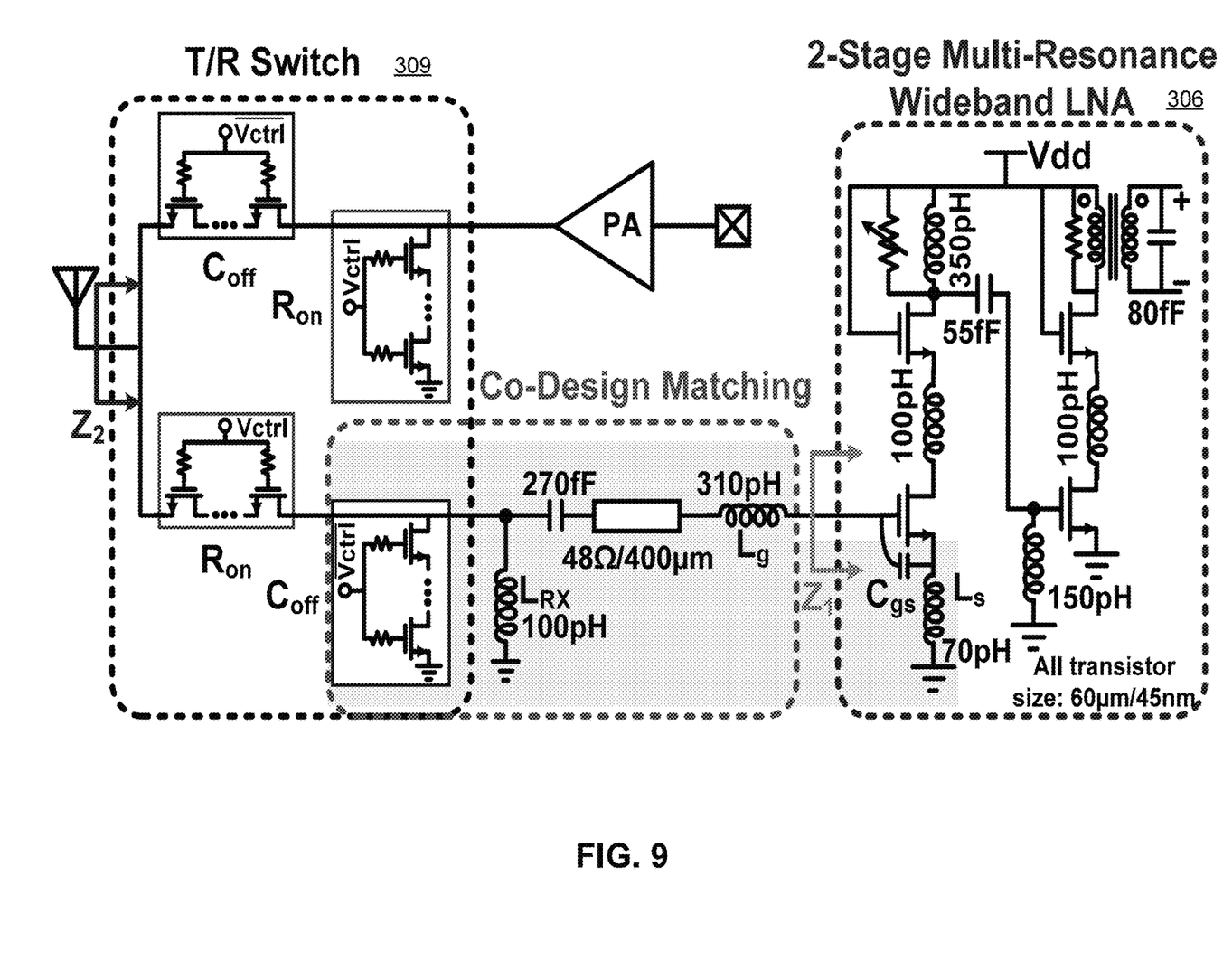
FIG. 9 is a schematic illustrating an impedance matching network between a T/R switch and an LNA according to one embodiment.

FIG. 9 is a schematic diagram illustrating a co-design of T/R switch 309 and LNA 306 with impedance matching network to further improve the performance. LNA 306 is designed with different resonant loads in two stages to serve as a wideband frontend. To mitigate the loading effect of the parasitic capacitors from T/R switch 309 and the off-state PA, separate shunt inductors are applied to the TX/RX inputs. The RX input shunt inductor $L_{RX}$ is further co-designed with $L_g$, $L_s$ and $C_{gs}$ of the first stage LNA, which creates a high-order network for wideband input marching.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A radio frequency (RF) receiver circuit, comprising:
    a low noise amplifier (LNA) to receive and amplify RF signals;
    a transformer-based in-phase quadrature (IQ) generator to generate a differential in-phase local oscillator (LOI) signal and a differential quadrature local oscillator (LOQ) signal based on a local oscillator (LO) signal received from a local oscillator;
    a plurality of load resistors coupled to an output of the transformer-based IQ generator, wherein each of the plurality of load resistors couples one of the differential LOI and the differential LOQ signals to a predetermined bias voltage; and
    a downconverter having one or more mixers coupled to the LNA and the transformer-based IQ generator to receive and mix the amplified RF signals with the differential LOI and the differential LOQ signals to down convert the amplified RF signals into intermediate frequency (IF) signals, wherein the IF signals are to be processed by a signal processing module.

2. The RF receiver circuit of claim 1, wherein the transformer-based IQ generator comprises:
    a positive LOI (LOI+) port to produce an LOI+ signal based on the LO signal;
    a negative LOI (LOI−) port to produce an LOI− signal based on the LO signal, wherein the LOI+ and LOI− signals represent the differential LOI signal;
    a positive LOQ (LOQ+) port to produce an LOQ+ signal based on the LO signal; and
    a negative LOQ (LOQ−) port to produce an LOQ− signal based on the LO signal, wherein the LOQ+ and LOQ− signals represent the differential LOQ signal.

3. The RF receiver circuit of claim 2, wherein the one or more mixers comprise a first mixer and a second mixer, and wherein the downconverter further comprises
    a first low-pass filter coupled to the first mixer to mix the RF signals with LOI+ signal to generate a positive in-phase IF (IFI+) signal;

a second low-pass filter coupled to the second mixer to mix the RF signals with LOI− signal to generate a negative in-phase IF (IFI−) signal; and a first IF amplifier coupled to the first and second low-pass filters to amplify the IFI+ and the IFI− signals to generate a first differential IF signal.

4. The RF receiver circuit of claim 3, wherein the one or more mixers further comprise a third mixer and a fourth mixer, and wherein the downconverter further comprises a third low-pass filter coupled to the third mixer to mix the RF signals with LOQ+ signal to generate a positive quadrature IF (IFQ+) signal;

a fourth low-pass filter coupled to the fourth mixer to mix the RF signals with LOQ− signal to generate a negative quadrature IF (IFQ−) signal; and a second IF amplifier coupled to the third and fourth low-pass filters to amplify the IFQ+ and the IFQ− signals to generate a second differential IF signal.

5. The RF receiver circuit of claim 4, wherein the downconverter further comprises a poly-phase filter (PPF) coupled to the first IF amplifier and the second IF amplifier to generate a third differential IF signal based on the first and the second differential IF signals; and a third IF amplifier coupled to the PPF to amplify the third differential IF signal to generate a fourth differential IF signal, wherein the fourth differential IF signal is processed by the signal processing module.

6. The RF receiver circuit of claim 2, wherein the plurality of load resistors comprises:

a first load resistor coupled between the LOI+ port and the predetermined bias voltage;

a second load resistor coupled between the LOI− port and the predetermined bias voltage;

a third load resistor coupled between the LOQ+ port and the predetermined bias voltage; and a fourth load resistor coupled between the LOQ− port and the predetermined bias voltage.

7. The RF receiver circuit of claim 1, wherein each of the plurality of load resistors is ranging from 50 to 500 ohms.

8. The RF receiver circuit of claim 1, wherein the differential LOI and the differential LOQ signals are ranging from 25 to 50 gigahertz (GHz).

9. The RF receiver circuit of claim 1, wherein each of the one or more mixers comprises:

a first stage amplifier having a first differential transistor pair having a first and a second transistor, wherein a first gate terminal of the first transistor and a second gate terminal of the second transistor together forms a differential RF input port to receive a differential RF input signal to be mixed; and a second stage amplifier having a second differential transistor pair having a third transistor with a third gate terminal and a fourth transistor with a fourth gate terminal and a third differential transistor pair having a fifth transistor with a fifth gate terminal and a sixth transistor with a sixth gate terminal, wherein the third gate terminal is coupled to the fifth gate terminal and the fourth gate terminal is coupled to the sixth gate terminal, wherein the third gate terminal and the fifth gate terminal forms a differential LO input port to receive a differential LO drive signal to drive the mixer.

10. The RF receiver circuit of claim 9, wherein a first drain terminal of the first transistor of the first differential transistor pair is coupled to source terminals of the third and the fourth transistors of the second differential transistor pair via a first inductor, and a second drain terminal of the second transistor of the first differential transistor pair is coupled to source terminals of the fifth and the sixth transistors of the third differential transistor pair via a second inductor.

11. The RF receiver circuit of claim 10, wherein the first inductor and the second inductor form a differential inductor pair.

12. The RF receiver circuit of claim 11, wherein the differential inductor pair comprises a single inductor footprint sharing a common virtual ground.

13. The RF receiver circuit of claim 9, wherein a drain terminal of the third transistor is coupled to a drain terminal of the fifth transistor as a first output, a drain terminal of the fourth transistor is coupled to a drain terminal of the sixth transistor as a second output, wherein the first and the second output forms a differential output port to output a differential mixed signal.

14. A radio frequency (RF) frontend circuit, comprising:

a transmitting and receiving (T/R) switch to be coupled to an antenna;

an RF transmitter coupled to the T/R switch to transmit first RF signals via the antenna; and an RF receiver coupled to the T/R switch to receive second RF signals via the antenna, wherein the T/R switch couples the RF transmitter or the RF receiver to the antenna at a particular point in time, wherein the RF receiver comprises:

a low noise amplifier (LNA) to receive and amplify the second RF signals, a transformer-based in-phase quadrature (IQ) generator to generate a differential in-phase local oscillator (LOI) signal and a differential local oscillator quadrature (LOQ) signal based on a local oscillator (LO) signal received from a local oscillator, a plurality of load resistors coupled to an output of the transformer-based IQ generator, wherein each of the plurality of load resistors couples one of the differential LOI and the differential LOQ signals to a predetermined bias voltage, and a downconverter having one or more mixers coupled to the LNA and the transformer-based IQ generator to receive and mix the amplified RF signals with the differential LOI and the differential LOQ signals to down convert the amplified RF signals into intermediate frequency (IF) signals, wherein the IF signals are to be processed by a signal processing module.

15. The RF frontend circuit of claim 14, wherein the transformer-based IQ generator comprises:

a positive LOI (LOI+) port to produce an LOI+ signal based on the LO signal;

a negative LOI (LOI−) port to produce an LOI− signal based on the LO signal, wherein the LOI+ and LOI− signals represent the differential LOI signal;

a positive LOQ (LOQ+) port to produce an LOQ+ signal based on the LO signal; and a negative LOQ (LOQ−) port to produce an LOQ− signal based on the LO signal, wherein the LOQ+ and the LOQ− signals represent the differential LOQ signal.

16. The RF frontend circuit of claim 15, wherein the plurality of load resistors comprises:

a first load resistor coupled between the LOI+ port and the predetermined bias voltage;

a second load resistor coupled between the LOI− port and the predetermined bias voltage;

a third load resistor coupled between the LOQ+ port and the predetermined bias voltage; and a fourth load resistor coupled between the LOQ− port and the predetermined bias voltage.

17. The RF frontend circuit of claim 14, wherein each of the plurality of load resistors is ranging from 50 to 500 ohms.

18. A mobile device, comprising:
   an antenna;
   a radio frequency (RF) receiver to receive RF signals via the antenna, the RF receiver including:
      a low noise amplifier (LNA) to receive and amplify the RF signals,
      a transformer-based in-phase quadrature (IQ) generator to generate a differential in-phase local oscillator (LOI) signal and a differential quadrature local oscillator (LOQ) signal based on a local oscillator (LO) signal received from a local oscillator,
      a plurality of load resistors coupled to an output of the transformer-based IQ generator, wherein each of the plurality of load resistors couples one of the differential LOI and the differential LOQ signals to a predetermined bias voltage, and
      a downconverter having one or more mixers coupled to the LNA and the transformer-based IQ generator to receive and mix the amplified RF signals with the differential LOI and the differential LOQ signals to down convert the amplified RF signals into intermediate frequency (IF) signals, wherein the IF signals are to be processed by a signal processing module; and
   a signal processor to process the IF signals.

19. The mobile device of claim 18, wherein the transformer-based IQ generator comprises:
   a positive LOI (LOI+) port to produce an LOI+ signal based on the LO signal;
   a negative LOI (LOI−) port to produce an LOI− signal based on the LO signal, wherein the LOI+ and the LOI− signals represent the differential LOI signal;
   a positive LOQ (LOQ+) port to produce an LOQ+ signal based on the LO signal; and
   a negative LOQ (LOQ−) port to produce an LOQ− signal based on the LO signal, wherein the LOQ+ and the LOQ− signals represent the differential LOQ signal.

20. The mobile device of claim 19, wherein the plurality of load resistors comprises:
   a first load resistor coupled between the LOI+ port and the predetermined bias voltage;
   a second load resistor coupled between the LOI− port and the predetermined bias voltage;
   a third load resistor coupled between the LOQ+ port and the predetermined bias voltage; and
   a fourth load resistor coupled between the LOQ− port and the predetermined bias voltage.

* * * * *